United States Patent [19]

Jordan et al.

[11] Patent Number: 4,521,827
[45] Date of Patent: * Jun. 4, 1985

[54] HEAT SINK MOUNTING

[75] Inventors: William D. Jordan, Dallas; Roger C. Hundt, Carrollton; James D. Pritchett, Plano, all of Tex.

[73] Assignee: Thermalloy, Inc., Dallas, Tex.

[*] Notice: The portion of the term of this patent subsequent to Sep. 6, 2000 has been disclaimed.

[21] Appl. No.: 457,409

[22] Filed: Jan. 12, 1983

Related U.S. Application Data

[60] Division of Ser. No. 314,202, Oct. 23, 1981, Pat. No. 4,403,102, which is a continuation of Ser. No. 93,281, Nov. 13, 1979, abandoned, which is a continuation-in-part of Ser. No. 8,032, Jan. 31, 1979, abandoned.

[51] Int. Cl.³ ............................. H05K 7/20; F28F 7/00
[52] U.S. Cl. ..................................... 361/386; 165/80 B
[58] Field of Search ......................... 29/832, 837, 840; 85/1 C; 165/80 B, 80 D; 174/52 H, 16 HS, 52 S, 52 PE; 357/74, 81, 82; 361/386, 388, 389, 417, 427

[56] References Cited

U.S. PATENT DOCUMENTS 1,988,926  1/1935  Thomson ............................. 10/1 R
3,200,296  8/1965  Bruestle ............................. 357/81 K
3,492,908  2/1970  Thurston ............................ 411/418
3,611,046  10/1971 Covert ............................... 361/387
3,836,825  9/1974  Hall et al. .......................... 361/386
4,007,477  2/1977  Goodman ............................ 357/81

FOREIGN PATENT DOCUMENTS 958155  5/1964  United Kingdom.

OTHER PUBLICATIONS

PEM® Penn Engr. & Mfg. Co., Bulletin K480, copyright 1962, '70, '71, '74, '76 and '80.

Primary Examiner—Howard N. Goldberg
Assistant Examiner—Carl J. Arbes
Attorney, Agent, or Firm—Richards, Harris, Medlock & Andrews

[57] ABSTRACT

Disclosed are methods and apparatus for attaching a heat sink mounted semiconductor case to a circuit board employing a stud with a flange near one end. The longer shank is threaded and at least the shorter shank or head stud is tin-plated. The stud may be swaged into a mounting hole in the heat sink and the heat sink and semiconductor case pre-assembled. The pre-assembled unit may then be mounted and soldered to the circuit board along with other circuit components.

10 Claims, 3 Drawing Figures

HEAT SINK MOUNTING

This is a division of application Ser. No. 314,202 entitled "Heat Sink Mounting" filed Oct. 23, 1981, U.S. Pat. No. 4,403,102, issued 9/6/83, which is a continuation of application Ser. No. 93,281 entitled "Heat Sink Mounting" filed Nov. 13, 1979 (now abandoned), which is a continuation-in-part of application Ser. No. 8,032 entitled "Heat Sink Mounting" filed Jan. 31, 1979 (now abandoned), all of which are assigned to the same assignee.

This invention relates to methods and apparatus for assembly of components on circuit boards and the like. More particularly, it relates to methods and apparatus for assembly and mounting of semiconductor devices and heat sinks for semiconductor devices and the like on printed circuit boards or other mounting substrates.

Many semiconductor devices generate heat during operation which much be dissipated to avoid damage to the device. In some devices the heat generated is dissipated sufficiently by the enclosure, header or leads. Other devices may be mounted on heat sinks comprising bodies of thermally conductive materials such as copper, aluminum or the like which dissipate the heat generated by the devices into the surrounding environment. Such heat sinks may be extruded or sheet metal bodies including heat dissipating fins or the like.

In many applications it is customary to mount a heat sink between the semiconductor header or case and the substrate on which the case is mounted, such as a circuit board or the like, so that the case and heat sink may be held in intimate broad-area contact to aid in conduction of thermal energy from the case to the heat sink and so that the case may be electrically connected to the mounting substrate by soldering or other means, if desired. Conventionally, a circuit employing a plurality of components, some of which utilize heat sinks, is pre-assembled with the individual components which do not employ heat sinks positioned on the circuit board. Thereafter, the components are attached to the circuit board by conventional wave soldering of the leads to the circuit pads. After cleaning and trimming, the circuit board is inspected and the heat sink and semiconductor device are hand mounted with loose hardware such as bolts or the like which pass through the circuit board. The leads from each heat sink mounted component must then be hand soldered to the circuit board, the mounting hardware installed, and the cleaning, trimming and inspection steps repeated.

In accordance with the present invention all the circuit components, including those mounted with heat sinks as well as the heat sink itself, may be pre-assembled on a circuit board or the like and soldered to the circuit board in a single soldering operation. Accordingly, the additional steps of hand mounting and soldering, etc., of heat sink mounted components is eliminated, resulting in a substantial time saving and reliability improvement.

In accordance with the present invention a novel mounting stud is employed which comprises a threaded shaft with a head or flange displaced from the end of the stud leaving a head stud extending in the direction opposite the threaded shaft. The head stud end of the stud is tin-plated. The shank of the shaft adjacent the flange on the threaded end is knurled or serrated so that the stud may be swaged or force-fitted into a mounting hole in the heat sink. Accordingly, the semiconductor case may be pre-assembled on the heat sink with the leads extending through holes in the heat sink. The pre-assembled semiconductor device and heat sink assembly may then be positioned on the circuit board and the semiconductor device leads and the mounting stud holding the heat sink and case together soldered to the circuit board in a single wave soldering operation along the other components. Accordingly, the conventional subsequent steps of mounting the heat sink with loose hardware, hand soldering and subsequent cleaning, trimming and inspection are totally eliminated. Pre-assembly of the heat sink and semiconductor case in accordance with the invention thus results in vast time savings in circuit board assembly operations, eliminates tedious hand assembly of circuit boards with loose hardware, and eliminates hand soldering. Thus not only is a vast saving in assembly time realized, but reliability of solder connections and uniformity of the soldering assembly process is vastly improved.

Other features and advantages of the invention will become more readily understood from the following detailed description when taken in connection with the appended claims and attached drawings in which:

Figure 1:
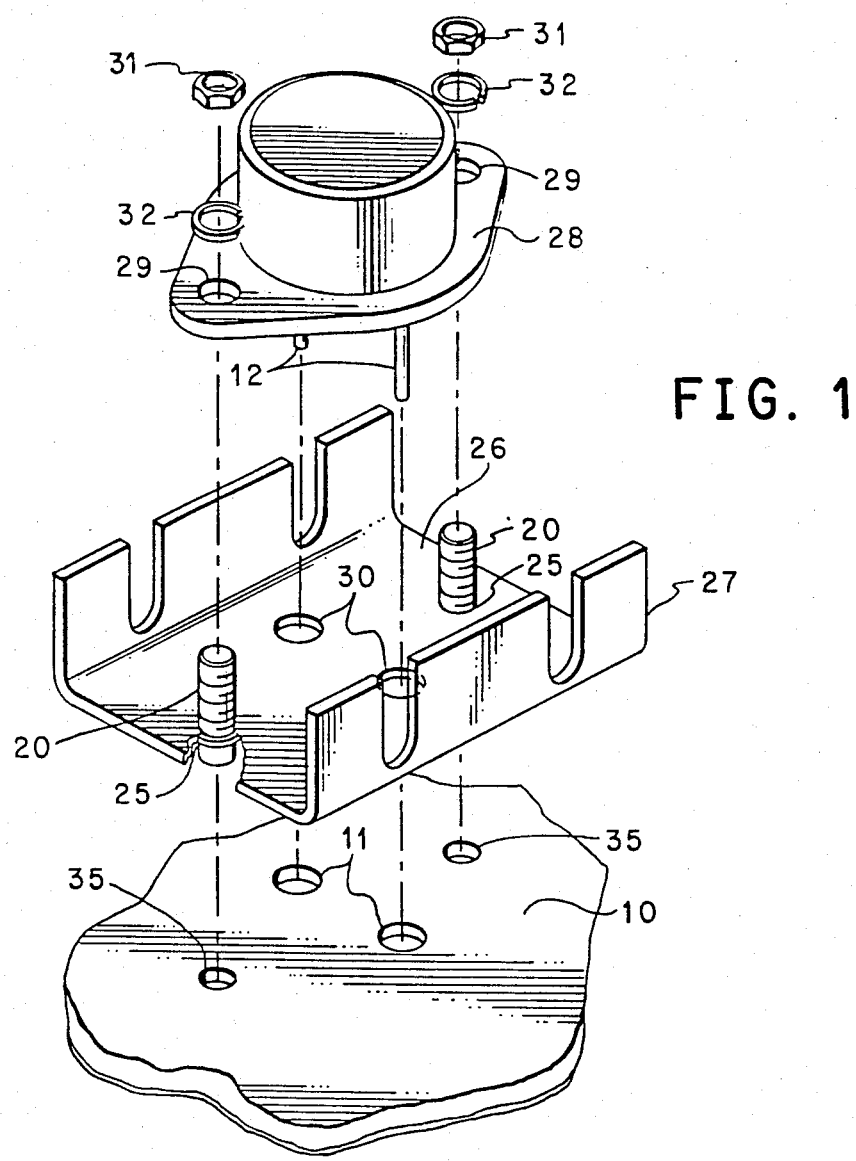
FIG. 1 is a exploded view of a heat sink mounting assembly on a circuit board employing the methods and apparatus of the invention.

Assembly of a semiconductor device case and heat sink on a circuit board or the like in accordance with the principles of the invention is illustrated in FIG. 1. While the invention is disclosed with particular reference to assembly of a semiconductor device encapsulated in a standard TO-3 type header and employs a single broad-base heat sink, it will be readily apparent that the principles of the invention are equally applicable to assembly of circuits employing various other encapsulation cases and other forms of heat sinks.

As illustrated in FIG. 1, a conventional printed circuit board 10 (shown only in portion) is employed for mounting and electrically interconnecting a plurality of discrete semiconductor components to form a circuit. Conventionally, the printed circuit board 10 is a non-conductive material having a conductive pattern (not shown) printed on the underside thereof. Semiconductor devices are positioned on the top surface of the board with their leads extending through holes 11. In the assembly operation, the semiconductor devices are positioned on the top surface of circuit board 10 with the leads 12 extending through the holes 11 and the leads electrically connected to the printed conductive circuit on the underside of the board by conventional wave soldering methods. The design, fabrication and assembly of circuit boards and circuit components is well known to those skilled in the art and therefore will not be described in detail herein.

When the circuit to be fabricated includes components which generate excessive thermal energy, it is frequently necessary to interpose a heat dissipating device, known as a heat sink, between the semiconductor case and the circuit board. Conventionally, the devices which do not employ heat sinks are first placed on the circuit board and their leads soldered to the circuit board by a first wave soldering operation. Thereafter, the devices employing heat sinks are attached to the heat sinks by conventional hardware such as screws, bolts or the like which pass through the circuit board. This is usually accomplished by positioning the semiconductor case on the heat sink with the semiconductor leads extending through the heat sink and into the printed circuit board eyelets. The semiconductor component leads are then hand soldered to the printed circuit and the heat sink and case attached to the board with loose hardware. Frequently, additional hardware or soldering is used to assure electrical contact between the case and the circuit board. Obviously, since the heat sink mounted devices are attached to the heat sink and the circuit board after the other components have been soldered thereto, the attachment of heat sink mounted devices is very time-consuming and risks damage to the already partially assembled circuit. Furthermore, since the soldering operation for the other components has been completed, the leads from the heat sink mounted components must be hand soldered to the circuit board. Such hand soldering is not only time-consuming, but results in less reliable electrical connections and possible damage to the previously soldered components.

Figure 2:
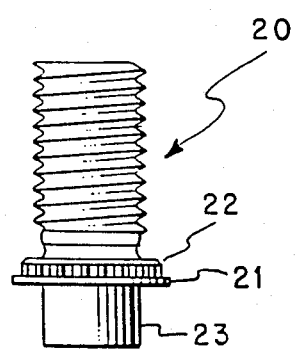
FIG. 2 is an elevational view of one embodiment of the novel mounting stud of the invention.

As illustrated in FIG. 1, the heat sink and semiconductor component may be pre-assembled employing the novel mounting stud illustrated in FIG. 2. Accordingly, the pre-assembled heat sink and semiconductor case assembly may be positioned on the printed circuit board along with the other components and soldered to the circuit board in a single soldering operation which attaches the assembly to the board, solders the leads, and provides electrical contact with the case.

As illustrated in FIGS. 1 and 2, the mounting stud 20 of the invention comprises an elongated cylindrical shaft having a relatively thin flange 21 radially extending therefrom, preferably near one end thereof. Adjacent the flange 21 and on the side thereof adjacent the longer portion of the shaft 20 is provided a slightly expanded and knurled or serrated base 22. The remainder of the longer portion of the shaft 20 is threaded with standard threads to accept standard nuts or the like. The entire stud 20, or at least the head stud portion 23, is preferably tin-plated to aid in forming solder connections thereto.

The stud 20 is force-fitted or swaged into a hole 25 in the flat base portion 26 of a heat sink 27. The heat sink may be of various types such as that illustrated in FIG. 1 including heat dissipating fins or various other conventional heat sink bodies. The tin-plated stud 20 and the heat sink 27 may be pre-assembled by suitable machine operations, thus eliminating tedious hand assembly of screws, bolts and the like. A standard semiconductor case 28 is then mounted on the heat sink with the studs 20 passing through mounting holes 29 and the semiconductor device leads 12 extending through holes 30 in the flat base portion 26 of the heat sink. Nuts 31 and lock washers 32 are positioned on the studs 20 and the pre-assembled case and heat sink is then ready for attachment to the circuit board 10.

Since the pre-assembled heat sink and case is to be attached to the circuit board by soldering, the pre-assembled unit may be treated in exactly the same manner as other circuit components. The components are simply positioned with their leads extending through the appropriate holes in the board and the pre-assembled unit is positioned with the tin-plated heads 23 extending through the holes 35 provided for attaching the heat sink. Since the head 23 of the stud 20 is pre-tinned, the pre-assembled unit is soldered to the circuit board in the same soldering operation used to solder the leads of the other components. Therefore, the conventional post-assembly and hand soldering operations are totally eliminated.

It should be noted that although the heat sink is attached to the circuit board when the head 23 is soldered, the nuts 31 are on top surface. Accordingly, the case 28 may be removed for replacement without removing the heat sink. Therefore, servicing and maintenance of circuit boards using the heat sink mounting of the invention is quite convenient.

Not only does the assembly process of the invention result in a major time saving; elimination of hand soldering operations improves reliability of the completed circuit boards. Any hand soldering operation conducted after partial assembly of the circuit board may result in accidental damage to the previously soldered connections. Furthermore, manual handling of the partially assembled boards to attach heat sinks thereto with conventional loose hardware also increases the risk of accidental damage. By soldering all the components in a single operation, the risks of post-soldering hand operations are totally eliminated.

The use of tin-plated studs also aids in permitting soldering of the heat sink mounting hardware to the circuit board. While the invention is described herein in terms of tin-plated components, it will be understood by those skilled in the art that the terms "tin-plated", "pre-tinned" and the like are used herein in the broadest sense to include coatings of conventional solder and solder-aiding or solder-promoting compositions such as tin, tin-lead alloys, fluxes and the like, regardless of the actual composition of the coating or the method by which it is applied.

It will be observed that employing a mounting stud 20 with a thin flange 21 as shown in FIGS. 1 and 2 results in mounting the flat base portion 26 of the heat sink 27 closely adjacent or even in contact with the circuit board surface. In some situations it is preferable to mount the heat sink 27 parallel to but spaced from the surface of the circuit board 10. In such cases, the stud 20 may be manufactured with an axially thickened flange 21. Alternatively, where relatively large spacing between the base 26 of the heat sink and the surface of the circuit board 10 is required, such as for better circulation of cooling air around the heat sink or to permit cleaning under the heat sink or the like, the stud 20 may include a stand-off shank as illustrated in FIG. 3.

Figure 3:
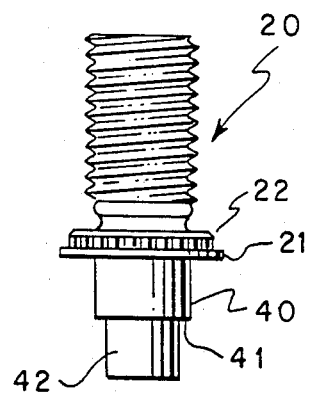
FIG. 3 is an elevational view of an alternative embodiment of the novel mounting stud of the invention.

In the alternative embodiment illustrated in FIG. 3, the stud 20 comprises an elongated cylindrical shaft having a relatively thin flange 21 radially extending therefrom. In this embodiment, however, the flange 21 may be near the central portion of the shaft. A slightly enlarged knurled or serrated base 22 is provided on the shaft adjacent one side of the flange 21 and the remainder of the shaft on the same end as the knurled base 22 is provided with standard threads or the like to accept standard nuts. Obviously, other means for securing the semiconductor case to the shaft 20 such as swage clasps or the like may be employed instead of the threaded connections shown. A stand-off shank 40 which is radially enlarged with respect to the head end 42 is interposed between the flange 21 and the head 42. Since the stand-off shank 40 is radially enlarged with respect to the head 42, a shoulder 41 is provided which rests on the top surface of the circuit board 10 when the head 42 is inserted in the mounting holes 35 in the circuit board. Accordingly, the base 26 of the heat sink 27 is spaced from the circuit board 10 by the axial length of stand-off shank 40. Therefore the stud 30 of FIG. 3 may be manufactured with the axial length of stand-off shank 40 of any length desired to provide the required spacing between the circuit board and the heat sink.

It will be readily appreciated that the functions of flange 21 and stand-off shank 40 can be accomplished by a single radially enlarged shaft or axially thickened flange. It will be further appreciated that the radial dimensions of the stand-off shank are determined by the diameter of the mounting holes 35 in the circuit board. Accordingly, the diameter of the shank 40 need not necessarily be the same as that of the remainder of the shaft 20 as shown, but may be larger than than of the remainder of the shaft, depending upon the diameter of the mounting holes 35 in which the stud is to be mounted, so that a shoulder 41 is provided between the head 42 and the stand-off shank 40. Furthermore, since only the head 42 will be soldered to the circuit board, only the head 42 need be coated or pre-tinned with a solder-promoting material. If desired, however, the entire stud 20 may be pre-tinned.

While the invention has been described with particular reference to specific embodiments thereof, it is to be understood that the forms of the invention shown and described in detail are to be taken as preferred embodiments thereof, and that various changes and modifications may be resorted to without departing from the spirit and scope of the invention as defined by the appended claims.

What is claimed:

1. In combination:
   (a) a heat sink including a substantially flat base portion; and
   (b) at least one mounting stud comprising an elongated shaft with a radially enlarged portion extending radially therefrom intermediate the ends thereof forming the largest diameter of said stud, the end portion of said shaft on one side of said radially enlarged portion extending through a hole in said flat base portion and at least one end portion of said stud coated with a solder-promoting material.

2. The combination set forth in claim 1 wherein said stud has a knurled section adjacent said radially enlarged portion which mates with said hole in said flat base portion and secures said stud to said flat base portion.

3. The combination set forth in claim 1 wherein said radially enlarged portion comprises a relatively thin radially extending flange.

4. The combination set forth in claim 3 wherein a portion of said shaft between said flange and one end of said shaft is radially enlarged with respect to said one end, thereby providing a shoulder between said one end and said flange.

5. The combination set forth in claim 1 wherein said at least one end portion of said stud is tin-plated.

6. In combination:
   (a) a heat sink including a substantially flat base portion; and
   (b) at least one mounting stud comprising an elongated shaft with a radially enlarged flange extending radially therefrom near one end thereof defining a shaft with a longer portion on one side of said flange and a shorter portion on the opposite side of said flange, the longer portion of said shaft extending through said flat base portion and at least the end portion of the shorter portion of said stud being tin-plated.

7. The combination set forth in claim 6 wherein said stud has a knurled section adjacent said radially enlarged flange which mates with a hole in said flat base portion and secures said stud to said flat base portion.

8. The combination set forth in claim 6 wherein a portion of said shaft between said flange and one end of said shaft is radially enlarged with respect to said one end, thereby providing a shoulder between said one end and said flange.

9. In combination:
   (a) at least one mounting stud comprising an elongated shaft with an enlarged flange extending radially therefrom intermediate the ends thereof defining a shaft with a first portion extending in a first direction from said flange and a second portion extending in the opposite direction from said flange, said flange forming the largest diameter of said stud;
   (b) a circuit board with at least the end of said second portion of said shaft fitted within a hole in said circuit board and soldered to said circuit board; and
   (c) part of said second portion of said shaft between said flange and said end portion thereof fitted within the hole in said circuit board enlarged with respect to the end fitted within said circuit board; thereby forming a shoulder for resting on the surface of said circuit board and spacing said flange from the surface of said circuit board.

10. The combination set forth in claim 9 including means for attaching a semiconductor case to said first portion of said shaft.

* * * * *

REEXAMINATION CERTIFICATE (837th)
United States Patent [19]
Jordan et al.

[11] B1 4,521,827
[45] Certificate Issued * Apr. 5, 1988

[54] HEAT SINK MOUNTING

[75] Inventors: William D. Jordan, Dallas; Roger C. Hundt, Carrollton; James D. Pritchett, Plano, all of Tex.

[73] Assignee: Thermalloy, Inc., Dallas, Tex.

Reexamination Request:
No. 90/000,889, Oct. 23, 1985

Reexamination Certificate for:
Patent No.: 4,521,827
Issued: Jun. 4, 1985
Appl. No.: 457,409
Filed: Jan. 12, 1983

[*] Notice: The portion of the term of this patent subsequent to Sep. 6, 2000 has been disclaimed.

Related U.S. Application Data

[60] Division of Ser. No. 314,202, Oct. 23, 1981, Pat. No. 4,403,102, which is a continuation of Ser. No. 93,281, Nov. 13, 1979, abandoned, which is a continuation-in-part of Ser. No. 8,032, Jan. 31, 1979, abandoned.

[51] Int. Cl.⁴ .................. H05K 7/20; F28F 7/00
[52] U.S. Cl. .................. 361/386; 29/837; 29/840; 165/80.3
[58] Field of Search .................. 29/832, 837, 840; 85/1 C; 165/80.3, 80.5; 174/52 H, 52 S, 52 PE, 16 HS; 357/74, 81, 82; 361/386, 388, 389, 417, 427

[56] References Cited

U.S. PATENT DOCUMENTS

| | | |
|---|---|---|
| 1,632,709 | 6/1927 | Miller . |
| 2,836,807 | 5/1958 | Goodfellow et al. ............ 339/275 |
| 2,991,440 | 7/1961 | Kulka ............................ 339/17 |
| 3,213,324 | 10/1965 | McAdam ....................... 317/100 |
| 3,222,580 | 10/1963 | Curll ............................. 317/234 |
| 3,465,212 | 9/1969 | Grimes et al. ................. 317/234 |
| 3,686,533 | 8/1972 | Garnier et al. ................ 317/100 |
| 3,987,344 | 10/1976 | Ambruoso, Sr. et al. ....... 317/100 |
| 4,054,901 | 10/1977 | Edwards et al. ............... 357/81 |
| 4,103,321 | 7/1978 | Gansert et al. ................ 361/388 |

OTHER PUBLICATIONS

Penn Engineering Bulletin K480, p. 4, of record (see stud "KFH"), also text of Bulletin.
PEM® Bulletin K-371; copyright 1971.

Primary Examiner—Carl E. Hall
Attorney, Agent, or Firm—Jack A. Kanz

[57] ABSTRACT

Disclosed are methods and apparatus for attaching a heat sink mounted semiconductor case to a circuit board employing a stud with a flange near one end. The longer shank is threaded and at least the shorter shank or head stud is tin-plated. The stud may be swaged into a mounting hole in the heat sink and the heat sink and semiconductor case pre-assembled. The pre-assembled unit may then be mounted and soldered to the circuit board along with other circuit components.

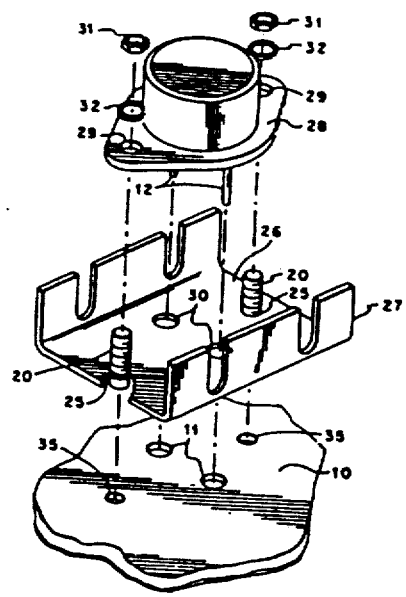

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 9 and 10 is confirmed.

Claims 1 and 6 are determined to be patentable as amended.

Claims 2–5, 7 and 8, dependent on an amended claim, are determined to be patentable.

New claim 11 is added and determined to be patentable.

1. [In] *The* combination *comprising:*
 (a) a heat sink including a substantially flat base portion; and
 (b) at least one mounting stud comprising an elongated shaft with a radially enlarged portion extending radially therefrom intermediate the ends thereof forming the largest diameter of said stud *and defining a head in fixed position with respect to each end of said shaft*, the end portion of said shaft on one side of said radially enlarged portion extending through a hole in said flat base portion and at least one end portion of said stud coated with a solder-promoting material *to permit securing said stud to a circuit board with conventional soldering techniques.*

6. [In] *The* combination *comprising:*
 (a) a heat sink including a substantially flat base portion; and
 (b) at least one mounting stud comprising an elongated shaft with a radially enlarged flange extending radially therefrom near one end thereof defining a shaft with a longer portion on one side of said flange and a shorter portion on the opposite side of said flange *and defining a head in fixed position with respect to each end of said shaft*, the longer portion of said shaft extending through said flat base portion and at least the end portion of the shorter portion of said stud being tin-plated *to permit securing said stud to a circuit board with conventional soldering techniques.*

*11. The combination comprising:*
 *(a) a heat sink including a substantially flat base portion; and*
 *(b) at least one stud means adapted for mounting and securing said heat sink on a circuit board comprising an elongated shaft with an integral enlarged portion forming the largest diameter of said stud means extending radially therefrom intermediate the ends thereof, said enlarged portion defining a head in fixed position with respect to each end of said shaft, the end portion of said shaft on one side of said enlarged portion extending through a hole in said flat base portion and at least one end of said stud means coated with means for securing said stud means to a circuit board with conventional soldering techniques.*

* * * * *